(12) United States Patent
Fujishima et al.

(10) Patent No.: US 12,405,538 B2
(45) Date of Patent: Sep. 2, 2025

(54) CALIBRATION METHOD, DETECTION SYSTEM, EXPOSURE APPARATUS, ARTICLE MANUFACTURING METHOD, AND NON-TRANSITORY COMPUTER-READABLE STORAGE MEDIUM

(71) Applicant: CANON KABUSHIKI KAISHA, Tokyo (JP)

(72) Inventors: Hironobu Fujishima, Saitama (JP); Wataru Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 259 days.

(21) Appl. No.: 18/296,418

(22) Filed: Apr. 6, 2023

(65) Prior Publication Data

US 2023/0341786 A1    Oct. 26, 2023

(30) Foreign Application Priority Data

Apr. 21, 2022    (JP) .................................. 2022-070268

(51) Int. Cl.
*G03F 7/00*        (2006.01)
*G03F 9/00*        (2006.01)

(52) U.S. Cl.
CPC .. *G03F 7/706845* (2023.05); *G03F 7/706849* (2023.05); *G03F 7/706851* (2023.05);
(Continued)

(58) Field of Classification Search
CPC ......... G03F 7/706845; G03F 7/706849; G03F 7/70725; G03F 9/7019; G03F 9/7088; G03F 7/70; G03F 7/70483–70541; G03F 7/70605–706851; G03F 9/70; G03F 9/7046; G03F 9/7049; G03F 9/7065–7096; G03F 7/706; G03F 7/70616;
(Continued)

(56) References Cited

U.S. PATENT DOCUMENTS 8,049,891  B2    11/2011  Maeda
11,231,573 B2    1/2022   Fujishima et al.
(Continued)

FOREIGN PATENT DOCUMENTS

JP        4944690 B2      6/2012
JP     2020170070 A      10/2020

*Primary Examiner* — Christina A Riddle
(74) *Attorney, Agent, or Firm* — ROSSI, KIMMS & McDOWELL LLP

(57)    ABSTRACT

A calibration method of a detection system including an illumination system configured to illuminate a detection target, and an imaging system configured to form an image of light from the detection target on a photoelectric conversion element, the method including obtaining, for each of at least two combinations of first apertures in the illumination system and second apertures in the imaging system, each of which is formed by selecting one first aperture and one second aperture from the plurality of first apertures and the plurality of second apertures, a defocus characteristic indicating a shift amount of the image on the photoelectric conversion element with respect to a defocus amount of the detection target in a state in which each of the first aperture and the second aperture is positioned in a first position shifted from a reference position.

12 Claims, 8 Drawing Sheets

(52) U.S. Cl.
CPC ........ *G03F 7/70725* (2013.01); *G03F 9/7019* (2013.01); *G03F 9/7088* (2013.01)

(58) Field of Classification Search
CPC .... G03F 7/7085; G03F 9/7069; G03F 9/7092; G03F 7/20; G03F 7/70775; G03F 7/70783; G03F 9/7026; G03F 9/7073; G03F 7/70275; G03F 7/70358; G06T 7/80; G06T 2207/30108; G06T 2207/30204; G06T 2207/10148; H04N 17/002; H04N 23/56; G01B 11/26; G01B 21/10; G01B 21/016; G01B 21/361; G02B 21/0016; G02B 21/10; G02B 21/361; G03B 27/32; G01M 11/02; G01M 11/04; H01L 21/027; G02F 1/1303; G02F 1/1337; G02F 1/133753; G02F 1/133788; G02F 1/133757; G02F 1/13
USPC ...... 355/18, 30, 52–55, 67–77; 356/399–401
See application file for complete search history.

(56) References Cited

U.S. PATENT DOCUMENTS

| | | | |
|---|---|---|---|
| 2004/0036879 A1* | 2/2004 | Fukui | G03F 9/7088 356/401 |
| 2012/0123581 A1* | 5/2012 | Smilde | G03F 7/70483 706/12 |
| 2015/0227061 A1* | 8/2015 | Tinnemans | G03F 9/7069 356/509 |
| 2019/0346771 A1* | 11/2019 | Pandey | G03F 7/70133 |
| 2020/0319447 A1* | 10/2020 | Fujishima | G02B 21/361 |

\* cited by examiner

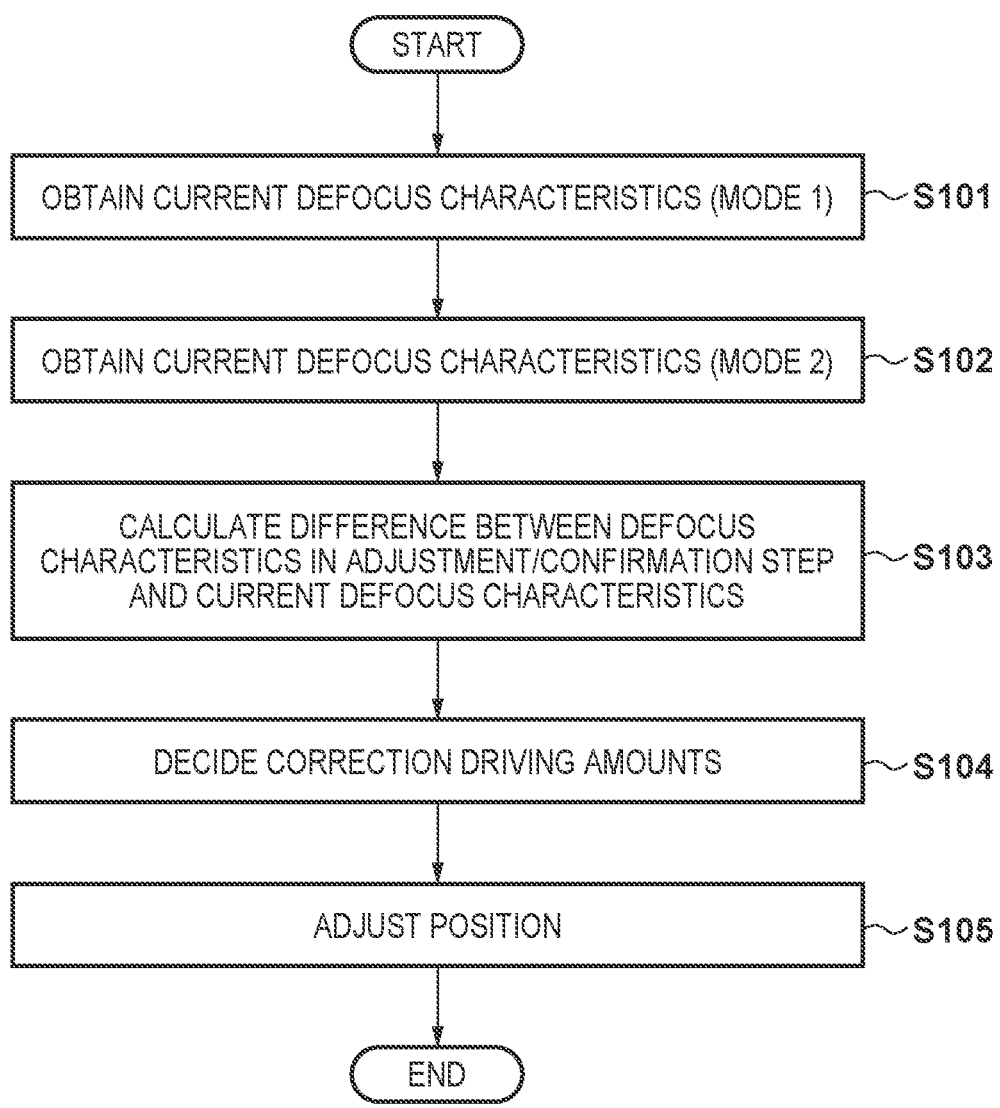

CALIBRATION METHOD, DETECTION SYSTEM, EXPOSURE APPARATUS, ARTICLE MANUFACTURING METHOD, AND NON-TRANSITORY COMPUTER-READABLE STORAGE MEDIUM

BACKGROUND OF THE INVENTION

Field of the Invention

The present invention relates to a calibration method, a detection system, an exposure apparatus, an article manufacturing method, and a non-transitory computer-readable storage medium.

Description of the Related Art

In recent years, an exposure apparatus used for the manufacture of a semiconductor device or the like is demanded to improve overlay accuracy between an original and a substrate along with further miniaturization of the resolution. Since the overlay accuracy corresponding to about ⅕ of the resolution is usually required, improvement of the overlay accuracy becomes more and more important as the miniaturization of a semiconductor device advances.

To improve the overlay accuracy, there is, for example, a method of accurately adjusting a position detection system of an exposure apparatus. Generally, the position detection system is optically configured, and includes an illumination system for illuminating a detection target (for example, a mark) formed on a substrate with detection (observation) light, and an imaging system for detecting an image of the detection target by concentrating light from the detection target. To implement a good imaging state of the position detection system, adjusting the position of an aperture stop, that is, a pupil formed in each of the illumination system and the imaging system is one of important technical problems requiring high positioning accuracy. Therefore, each of Japanese Patent No. 4944690 and Japanese Patent Laid-Open No. 2020-170070 has proposed a technique that adjusts the position of the aperture stop of at least one of the illumination system and the imaging system of the position detection system.

Unfortunately, maintaining the pupil position adjusted by using, for example, the technique disclosed in Japanese Patent No. 4944690 or Japanese Patent Laid-Open No. 2020-170070 in the illumination system or the imaging system of the position detection system over an operation period of the exposure apparatus on the user site is also an important technical problem different from the initial adjustment. Generally, to cope with the limit of holding of the aperture stop resulting from the mechanical accuracy and the reset of the exposure apparatus including power shutdown, the pupil position adjusted in the illumination system or the imaging system of the detection system is stored by using an encoder. However, the use of the encoder is costly, and, in addition to that, the encoder itself generates heat, and this may fluctuate the refractive index of air in the exposure apparatus. Also, unlike the initial adjustment in the manufacturing process of the exposure apparatus, tools and the time for adjustment are largely restricted on the user site. Accordingly, in the illumination system and the imaging system of the position detection system, a technique capable of returning to the initially adjusted pupil position in a self-contained manner in the exposure apparatus without using an encoder is demanded.

SUMMARY OF THE INVENTION

The present invention provides a technique advantageous in calibrating a detection system for detecting the position of a detection target.

According to one aspect of the present invention, there is provided a calibration method of a detection system including an illumination system configured to illuminate a detection target, and an imaging system configured to form an image of light from the detection target on a photoelectric conversion element, wherein the illumination system includes a plurality of first apertures selectively arranged in a pupil plane of the illumination system and having different openings, the imaging system includes a plurality of second apertures selectively arranged in a pupil plane of the imaging system and having different openings, and the method includes obtaining, for each of at least two combinations of first apertures and second apertures, each of which is formed by selecting one first aperture and one second aperture from the plurality of first apertures and the plurality of second apertures, a first defocus characteristic indicating a shift amount of the image on the photoelectric conversion element with respect to a defocus amount of the detection target in a state in which each of the first aperture and the second aperture is positioned in a first position shifted from a reference position, and performing position adjustment on each of the first aperture and the second aperture such that each of the first aperture and the second aperture is positioned in the reference position, based on a reference defocus characteristic indicating a shift amount of the image on the photoelectric conversion element with respect to a defocus amount of the detection target in a state in which each of the first aperture and the second aperture is positioned in the reference position, and on the first defocus characteristic obtained in the obtaining.

Further aspects of the present invention will become apparent from the following description of exemplary embodiments with reference to the attached drawings.

BRIEF DESCRIPTION OF THE DRAWINGS

FIG. 9 is a flowchart for explaining a process (calibration method) of calibrating the position detection system.

DESCRIPTION OF THE EMBODIMENTS

Figure 1:
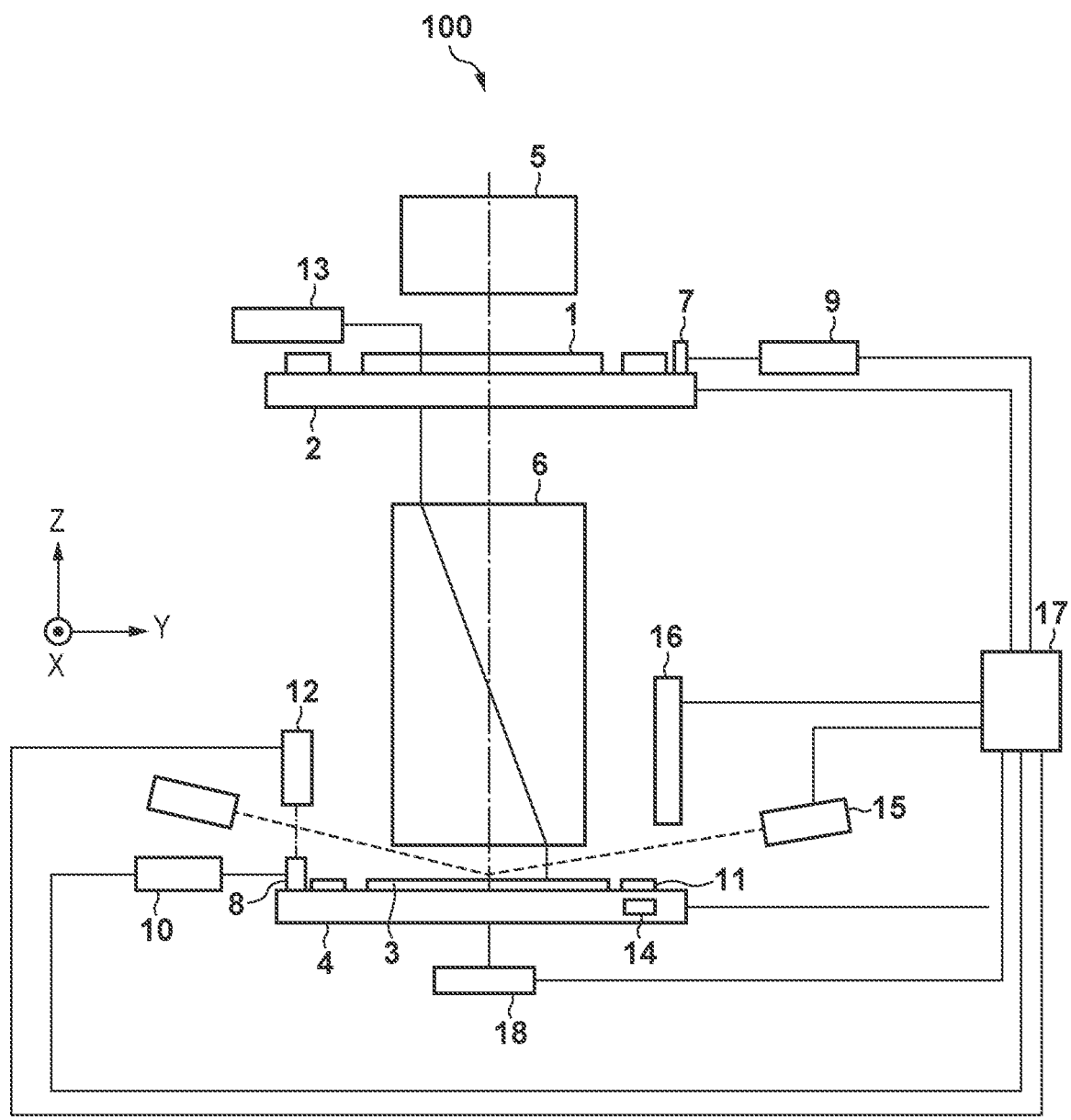
FIG. 1 is a schematic view illustrating configurations of an exposure apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an exposure apparatus 100 according to an aspect of the present invention. The exposure apparatus 100 is a lithography apparatus that exposes a substrate via an original to form a pattern on the substrate. The exposure apparatus 100 includes an original stage 2 that holds an original 1 (reticle or mask), a substrate stage 4 that holds a substrate 3, and an illumination optical system 5 that illuminates the original 1 held by the original stage 2. The exposure apparatus 100 also includes a projection optical system 6 that projects (the image of) the pattern of the original 1 to the substrate 3 held by the substrate stage 4, and a control unit 17 that comprehensively controls the overall operation of the exposure apparatus 100.

In this embodiment, the exposure apparatus 100 is a scanning exposure apparatus (scanner) that transfers the pattern of the original 1 to the substrate 3 while synchronously scanning the original 1 and the substrate 3 in the scanning direction (that is, by a step & scan method). However, the exposure apparatus 100 may be an exposure apparatus (stepper) that transfers the pattern of the original 1 to the substrate 3 while fixing the original 1 (that is, by the step & scan method).

In the following description, as illustrated in FIG. 1, a direction (optical axis direction) coincident with the optical axis of the projection optical system 6 will be defined as the Z direction. The scanning direction of the original 1 and the substrate 3 in a plane perpendicular to the Z direction will be defined as the Y direction. A direction (non-scanning direction) perpendicular to the Z and Y directions will be defined as the X direction. Directions around the X-, Y-, and Z-axes will be defined as OX, OY, and OZ directions, respectively.

The illumination optical system 5 illuminates the original 1, more specifically, a predetermined illumination region on the original with light (exposure light) of a uniform illuminance distribution. Examples of the exposure light are the g-ray and i-ray of ultra-high pressure mercury lamps, a KrF excimer laser, an ArF excimer laser, and an $F_2$ laser. To manufacture a smaller semiconductor element, Extreme UltraViolet light (EUV light) of several nm to several hundred nm may be used as the exposure light.

The original stage 2 is configured to be two-dimensionally movable in a plane perpendicular to the optical axis of the projection optical system 6, that is, in the X-Y plane and be rotatable in the OZ direction while holding the original 1. A driving mechanism (not shown) such as a linear motor drives the original stage 2.

A mirror 7 is provided on the original stage 2. A laser interferometer 9 is provided at a position facing the mirror 7. The laser interferometer 9 measures in real time the two-dimensional position and rotation angle of the original stage 2 (the original 1 held by the original stage 2), and outputs the measurement result to the control unit 17. The control unit 17 controls the driving mechanism based on the measurement result of the laser interferometer 9, and positions the original 1 held by the original stage 2.

The projection optical system 6 includes a plurality of optical elements, and projects the pattern of the original 1 to the substrate 3 at a predetermined projection magnification β. In this embodiment, the projection optical system 6 is a reduction optical system having the projection magnification β of, for example, ¼ or ⅕.

The substrate stage 4 includes a Z stage that holds the substrate 3 via a chuck, an X-Y stage that supports the Z stage, and a base that supports the X-Y stage. A driving mechanism 18 including a linear motor and the like drives the substrate stage 4.

A mirror 8 is provided on the substrate stage 4. Laser interferometers 10 and 12 for measuring the position of the substrate stage 4 are provided at positions facing the mirror 8. The laser interferometer 10 measures positions of the substrate stage 4 in the X direction, Y direction, and OZ direction in real time, and outputs the measurement result to the control unit 17. The laser interferometer 12 measures positions of the substrate stage 4 in the Z direction, OX direction, and OY direction in real time, and outputs the measurement result to the control unit 17. The control unit 17 controls the driving mechanism 18 based on the measurement results of the laser interferometers 10 and 12, thereby positioning the substrate 3 held by the substrate stage 4.

Figure 2:
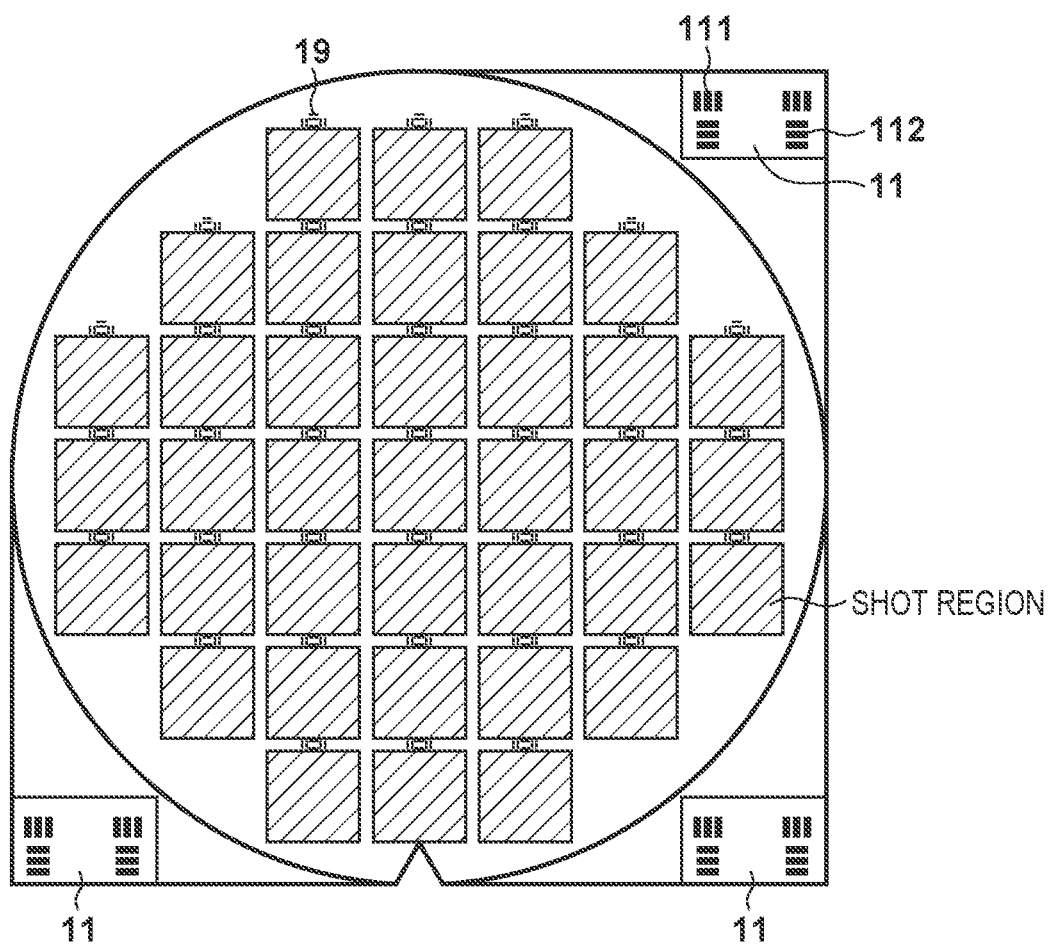
FIG. 2 is a view illustrating detailed configurations of a stage reference plate.

A stage reference plate 11 is provided on the substrate stage 4 so as to be almost flush with the surface of the substrate 3 held by the substrate stage 4. FIG. 2 is a view illustrating the detailed configurations of the stage reference plate 11 provided on the substrate stage 4. The stage reference plate 11 may be provided at one corner of the substrate stage 4, or may be provided at each of a plurality of corners of the substrate stage 4. Alternatively, the stage reference plate 11 may be provided along a side of the substrate stage 4. In this embodiment, as illustrated in FIG. 2, three stage reference plates 11 are provided on the substrate stage 4.

As illustrated in FIG. 2, the stage reference plate 11 includes a reference mark 111 to be detected by original position detection systems 13 and 14, and a reference mark 112 to be detected by a position detection system 16. The stage reference plate 11 may include a plurality of the reference marks 111 and a plurality of the reference marks 112. The positional relationship (X and Y directions) between the reference mark 111 and the reference mark 112 is set to a predetermined positional relationship (that is, it is known). Note that the reference mark 111 and the reference mark 112 may be common marks.

The original position detection system 13 is provided near the original stage 2. The original position detection system 13 detects an original reference mark (not shown) provided on the original 1 held by the original stage 2, and the reference mark 111 provided on the stage reference plate 11 on the substrate stage through the projection optical system 6. The original position detection system 13 detects the original reference mark provided on the original 1, and the reference mark 111 through the projection optical system 6 by using the same light source as one used when actually exposing the substrate 3. More specifically, the original position detection system 13 detects, by an image sensor (for example, a photoelectric conversion element such as a CCD camera), beams reflected by the original reference mark and the reference mark 111 (reflective mark). The original 1 and the substrate 3 are aligned based on a detection signal from the image sensor. At this time, the position and focus are adjusted between the original reference mark provided on the original 1 and the reference mark 111 provided on the stage reference plate 11. As a result, the relative positional relationship (X, Y, and Z) between the original 1 and the substrate 3 can be adjusted.

The original position detection system 14 is provided on the substrate stage 4. The original position detection system 14 is a transmission detection system and is used when the reference mark 111 is a transmission mark. The original position detection system 14 detects the original reference mark provided on the original 1 and the reference mark 111 provided on the stage reference plate 11 by using the same light source as one used when actually exposing the substrate 3. More specifically, the original position detection system 14 detects, by a light amount sensor, the transmitted light having passed through the original reference mark and the reference mark 111. At this time, the original position detection system 14 detects the amount of transmitted light while moving the substrate stage 4 in the X direction (or Y direction) and the Z direction. Accordingly, the position and focus can be adjusted between the original reference mark provided on the original 1 and the reference mark 111 provided on the stage reference plate 11.

In this way, the original position detection system 13 or the original position detection system 14 can be arbitrarily used to adjust the relative positional relationship (X, Y, and Z) between the original 1 and the substrate 3.

A focus detection system 15 includes a light projecting system that obliquely projects light to the surface of the substrate 3, and a light receiving system that receives light reflected by the surface of the substrate 3. The focus detection system 15 detects the Z-direction (height-direction) position of the substrate 3, and outputs the detection result to the control unit 17. The control unit 17 controls the driving mechanism 18 based on the detection result of the focus detection system 15 to adjust the Z-direction position (focus position) and inclination angle of the substrate 3 held by the substrate stage 4.

The position detection system 16 includes an illumination system that illuminates an alignment mark 19 as a detection target on a substrate and the reference mark 112 of the stage reference plate 11, and an imaging system that forms images of light (reflected light) from the alignment mark 19 and the reference mark 112 on a photoelectric conversion element. The position detection system 16 detects the alignment mark 19 and the reference mark 112, and outputs the detection results to the control unit 17. The control unit 17 controls the driving mechanism 18 based on the detection result (the position of the alignment mark 19) of the position detection system 16 to drive the substrate stage 4, thereby adjusting the X- and Y-direction positions of the substrate 3 held by the substrate stage 4.

In general, the arrangement of an optical position detection system for detecting (observing) an alignment mark on a substrate is roughly divided into two: an off-axis detection system and a Through The Lens (TTL) detection system. The off-axis detection system optically detects an alignment mark provided on a substrate without the intervention of a projection optical system. The TTL detection system detects an alignment mark provided on a substrate through a projection optical system by using light (non-exposure light) different in wavelength from exposure light. Although the position detection system 16 is the off-axis detection system in this embodiment, the detection method is not limited. For example, when the position detection system 16 is the TTL detection system, it detects the alignment mark 19 provided on the substrate 3 through the projection optical system 6. Except this, the basic arrangement is the same as that of the off-axis detection system.

Figure 3:
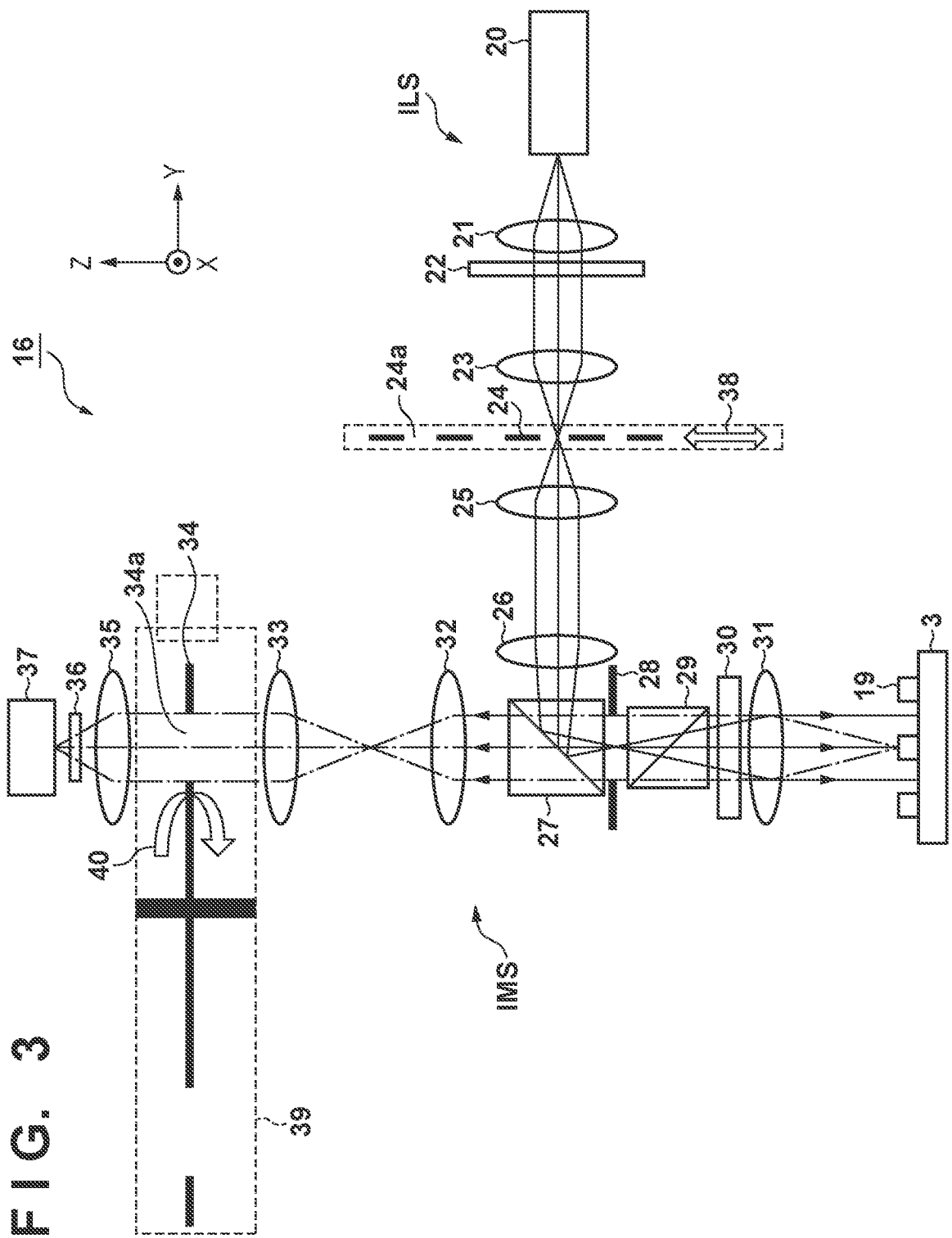
FIG. 3 is a view illustrating detailed configurations of a position detection system.

FIG. 3 is a view illustrating the detailed configurations of the position detection system 16 including an illumination system ILS and an imaging system IMS. The position detection system 16 includes a light source 20, a first illumination optical system 21, a wavelength filter plate 22, a second illumination optical system 23, an aperture stop plate 24, a third illumination optical system 25, a fourth illumination optical system 26, a polarizing beam splitter 27, an NA stop 28, and a prism 29. The position detection system 16 also includes a λ/4 plate 30, an objective lens 31, a relay lens 32, a first imaging optical system 33, an aperture stop plate 34, a second imaging optical system 35, a wavelength shift difference adjustment optical member 36, a photoelectric conversion element 37, and switching mechanisms 38 and 39.

In this embodiment, the light source 20 emits visible light (for example, light having a wavelength of 500 nm or more to 700 nm or less), light of the blue wavelength (for example, light having a wavelength of 450 nm or more to 550 nm or less (blue wavelength light)), and infrared light (for example, light having a wavelength of 700 nm or more to 1,500 nm or less). The light (illumination light) emitted by the light source 20 passes through the first illumination optical system 21, the wavelength filter plate 22, and the second illumination optical system 23, and reaches the aperture stop plate 24 positioned on the pupil plane (optical Fourier transform plane with respect to the object plane) of the position detection system 16.

The wavelength filter plate 22 includes a plurality of wavelength filters different in the wavelength band (transmission wavelength band) of light to be transmitted. One wavelength filter is selected from the plurality of wavelength filters under the control of the control unit 17, and is inserted in the optical path of the position detection system 16. In this embodiment, the wavelength filter plate 22 includes a wavelength filter that transmits visible light, a wavelength filter that transmits blue wavelength light, and a wavelength filter that transmits infrared light. By switching between these wavelength filters in the wavelength filter plate 22, the wavelength band of light for illuminating the alignment mark 19 provided on the substrate 3 can be selected. The wavelength filter plate 22 may be configured so that a new wavelength filter can be added in addition to the plurality of wavelength filters provided in advance.

The aperture stop plate 24 includes a plurality of aperture stops 24a (first apertures) having different numerical apertures (aperture (opening) sizes, NA) and different aperture (opening) shapes. The plurality of aperture stops 24a are selectively arranged in the pupil plane of the illumination system ILS. In this embodiment, an illumination mode for illuminating the alignment mark 19 can be changed by switching the optical paths of the illumination system ILS of the position detection system 16, more specifically, by switching the aperture stops 24a to be arranged in the pupil (pupil plane), under the control of the control unit 17. The aperture stop plate 24 can also have a configuration capable of adding a new aperture stop, in addition to the plurality of aperture stops 24a formed in advance.

In the aperture stop plate 24, various systems can be adopted as the switching mechanism 38 for switching the aperture stops 24a to be arranged in the optical path of the illumination system ILS of the position detection system 16. As an example, FIG. 3 shows the switching mechanism 38 using a guide rail system that selects a desired aperture stop 24a to be arranged in the optical path of the illumination system ILS by sliding the aperture stop plate 24 in which the plurality of aperture stops 24a are linearly arrayed. After the desired aperture stop 24a is selected, the switching mechanism 38 can also finely adjust the position of the aperture stop 24a in the Z direction by slightly sliding the aperture stop plate 24. An operation like this can be implemented when the switching mechanism 38 has, for example, a linear/pulse motor.

The direction in which the switching mechanism 38 operates the aperture stop plate 24 need not be one-dimensional. For example, the switching mechanism 38 can two-dimensionally operate the aperture stop plate 24 in a plane (Z-X plane) perpendicular to the optical axis of the illumination system ILS. Position adjustment (pupil adjustment) in the Z-X plane is performed on the aperture stop 24a arranged in the optical path of the illumination system ILS, such that the imaging performance of the whole position detection system 16 improves by combining the aperture stop 24a and the aperture stop 34a arranged in the optical path of the imaging system IMS.

The light having passed through the aperture stop plate 24 (the aperture stop 24a) is guided to the polarizing beam splitter 27 via the third and fourth illumination optical systems 25 and 26. Of the light guided to the polarizing beam splitter 27, S-polarized light perpendicular to the paper surface is reflected by the polarizing beam splitter 27 and passes through the NA stop 28 and the prism 29. The NA stop 28 is a variable NA stop capable of changing the NA by changing the aperture amount under the control of the control unit 17. The prism 29 is used to branch the optical path to an optical system (not shown). Light from the prism 29 is converted into circularly polarized light through the λ/4 plate 30, and illuminates the alignment mark 19 formed on the substrate 3 via the objective lens 31.

Light (detection light) diffracted by the alignment mark 19 is converted into P-polarized light parallel to the paper surface through the objective lens 31 and the λ/4 plate 30, and transmitted through the polarizing beam splitter 27 via the prism 29 and the NA stop 28. The light transmitted through the polarizing beam splitter 27 passes through the relay lens 32, the first imaging optical system 33, and the aperture stop plate 34.

The aperture stop plate 34 includes a plurality of aperture stops 34a (second stops) having different numerical apertures (aperture (opening) sizes, NA) and different aperture (opening) shapes. The plurality of aperture stops 34a are selectively arranged in the pupil plane of the imaging system IMS. In this embodiment, a detection mode for detecting the alignment mark 19 can be changed by switching the optical paths of the imaging system IMS of the position detection system 16, more specifically, by switching the aperture stops 34a to be arranged in the pupil (pupil plane), under the control of the control unit 17. The aperture stop plate 34 can also have a configuration capable of adding a new aperture stop, in addition to the plurality of aperture stops 34a formed in advance.

In the aperture stop plate 34, various systems can be adopted as the switching mechanism 39 for switching the aperture stops 34a to be arranged in the optical path of the imaging system IMS of the position detection system 16. As an example, FIG. 3 shows the switching mechanism 39 using a turret system that selects a desired aperture stop 34a to be arranged in the optical path of the imaging system IMS by rotating (driving), around a rotating shaft 40, the aperture stop plate 34 in which the plurality of aperture stops 34a are arrayed. Note that the plurality of aperture stops 34a are arrayed in the aperture stop plate 34 such that the aperture centers are positions on a single circumference. Note also that after the desired aperture stop 34a is selected, the switching mechanism 39 can finely adjust the rotating shaft 40 in a direction in the paper surface (a direction perpendicular to the optical axis of the imaging system). Consequently, position adjustment (pupil adjustment) in the X-Y plane is performed on the aperture stop 34a arranged in the optical path of the imaging system IMS, such that the imaging performance of the whole position detection system 16 improves by combining the aperture stop 34a and the aperture stop 24a arranged in the optical path of the illumination system ILS.

In this embodiment, the switching mechanisms 38 and 39 adopt the guide rail system and the turret system as the systems for switching the aperture stops. However, the present invention is not limited to them. For example, another system may also be adopted if switching (selection) of aperture stops and fine adjustment of the selected aperture stop are possible.

The light having passed through the aperture stop plate 34 (the aperture stop 34a) arrives at the photoelectric conversion element 37 (for example, an image sensor such as a CCD image sensor) via the second imaging optical system 35 and the wavelength shift difference adjustment optical member 36. The photoelectric conversion element 37 detects the light from the alignment mark 19. The storage time can be prolonged until the intensity of the light exceeds a predetermined threshold value. The control unit 17 controls the storage time of the photoelectric conversion element 37.

In the exposure apparatus 100, the control unit 17 decides the driving amount of the driving mechanism 18 for driving the substrate stage 4, based on the position information of the alignment mark 19 obtained by the position detection system 16, and performs exposure (overlay exposure) on the substrate 3.

A method of calibrating the position detection system 16 according to this embodiment and effects obtained by the calibration method will be explained below. First, practical configurations of the switching mechanism 38 for switching the aperture stops 24a to be arranged in the optical path of the illumination system ILS of the position detection system 16 and the switching mechanism 39 for switching the aperture stops 34a to be arranged in the optical path of the imaging system IMS of the position detection system 16 will be explained.

Figure 4:
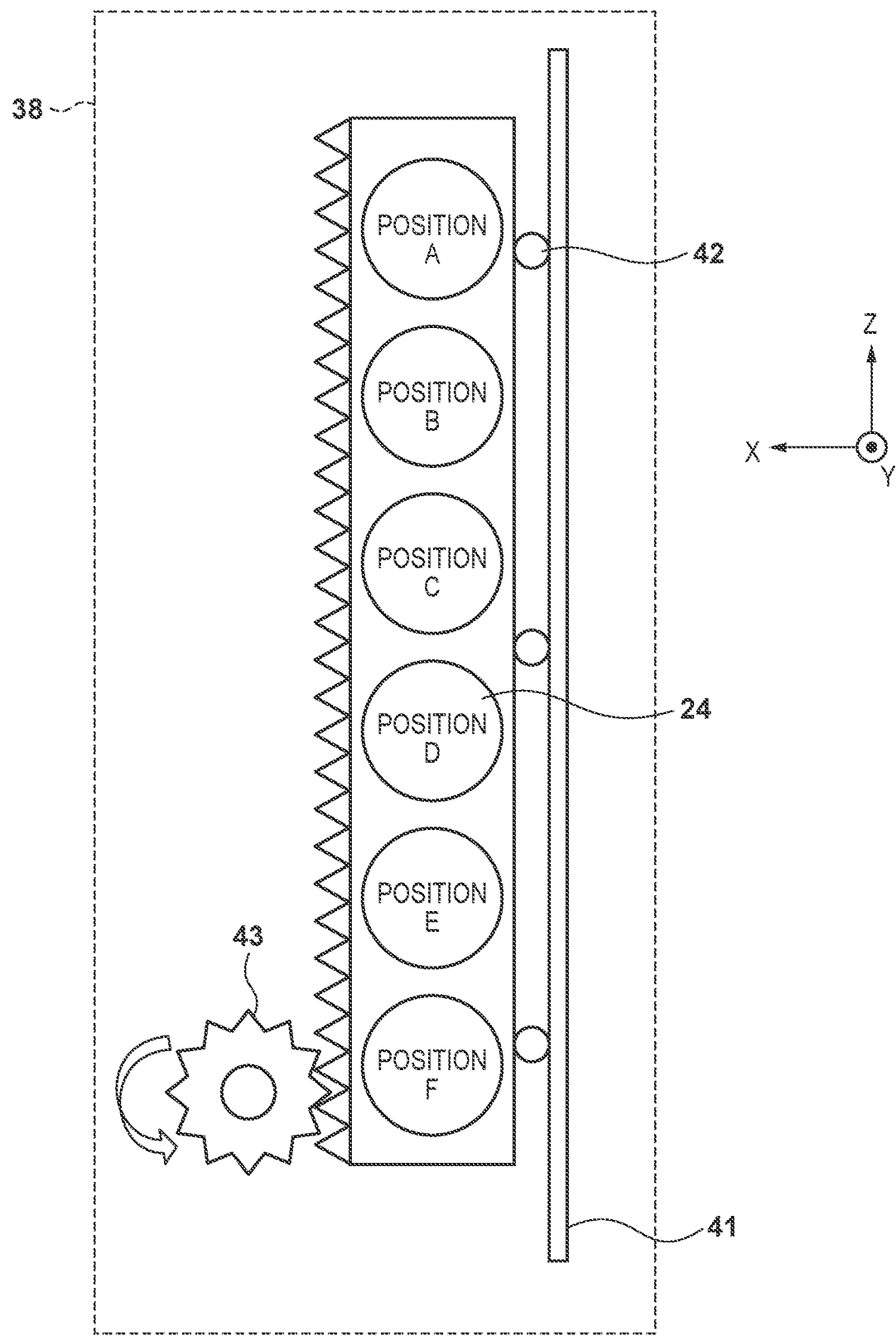
FIG. 4 is a view illustrating a practical configuration of a switching mechanism.

FIG. 4 is a view showing a practical configuration of the switching mechanism 38 adopting the guide rail system. Referring to FIG. 4, the aperture stop plate 24 (a light-shielding plate) is attached to a guide rail 41 via bearings 42, and drivable in the Z direction by a gear 43. In the aperture stop plate 24, the plurality of aperture stops 24a different in NA and shape are linearly arrayed. In the aperture stop plate 24, positions (ranges) in which the aperture stops 24a should exist are indicated by circles in which positions A to F are written. For example, the aperture stop 24a to be arranged in the optical path of the illumination system ILS of the position detection system 16 exists in the position of the circle in which position D is written.

Figure 5:
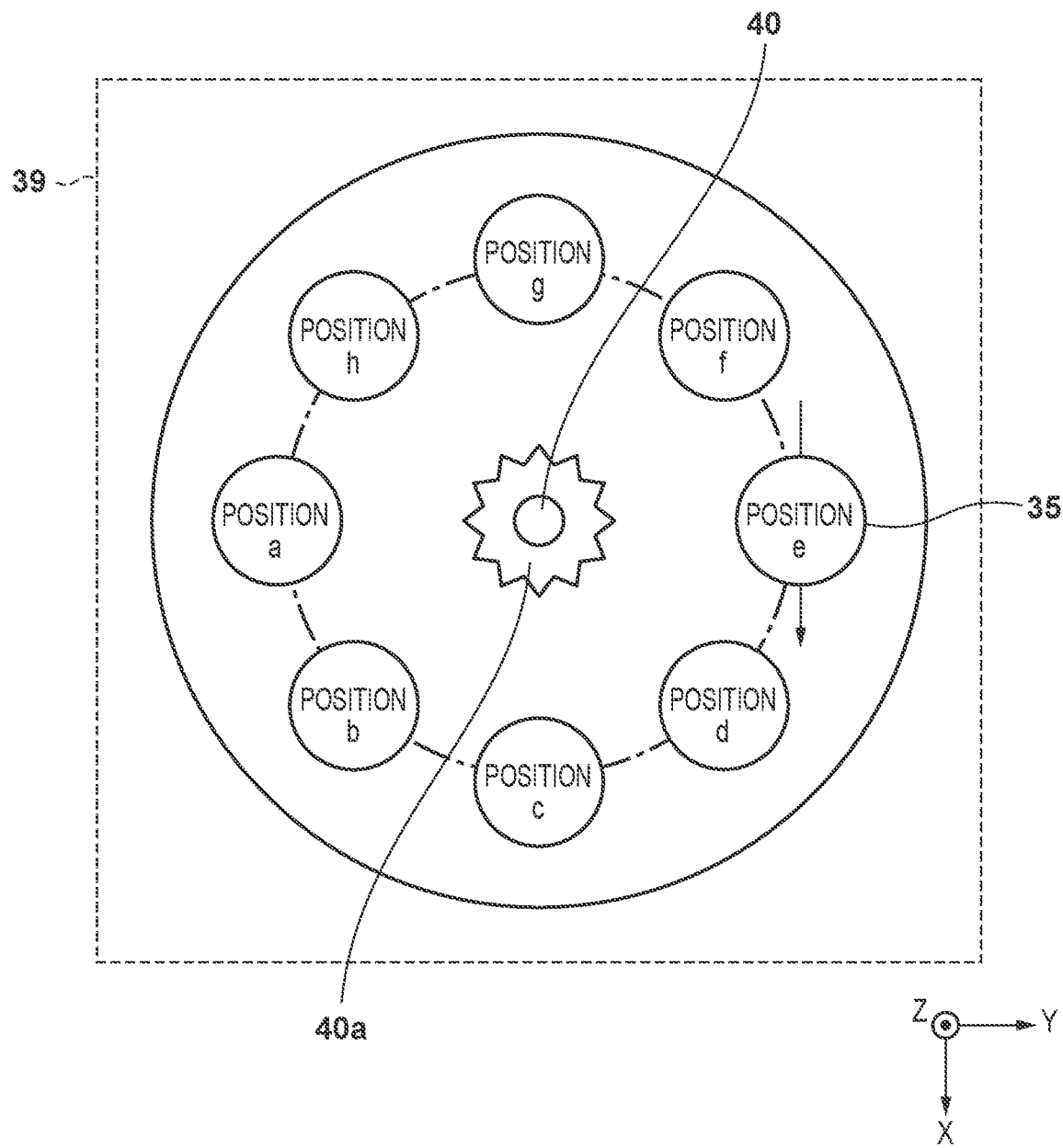
FIG. 5 is a view illustrating a practical configuration of a switching mechanism.

FIG. 5 is a view showing a practical configuration of the switching mechanism 39 adopting the turret system. Referring to FIG. 5, the aperture stop plate 34 (a light-shielding plate) can be rotated (driven) around the rotating shaft 40 by a gear 40a integrated with the rotating shaft 40. In the aperture stop plate 34, the plurality of aperture stops 34a different in NA and shape are arranged such that their aperture centers are positioned on a single circumference. In the aperture stop plate 34, positions (ranges) in which the aperture stops 34a should exist are indicated by circles in which positions a to g are written. For example, the aperture stop 34a to be arranged in the optical path of the imaging system IMS of the position detection system 16 exists in the position of a circle in which position e is written.

Note that the number of the aperture stops 24*a* arrayed in the aperture stop plate 24 and that of the aperture stops 34*a* arranged in the aperture stop plate 34 can be either the same or different. Note also that the shape (aperture shape) of the aperture stops 24*a* and 34*a* need not be circular, and the transmittance of the aperture need not be 100%.

As shown in FIGS. 4 and 5, a plurality of combinations of the aperture stop 24*a* to be arranged in the optical path of the illumination system ILS of the position detection system 16 and the aperture stop 34*a* to be arranged in the optical path of the imaging system IMS of the position detection system 16 generally exist. However, regardless of a combination of the aperture stops 24*a* and 34*a*, it is necessary to adjust the positions of the aperture stops 24*a* and 34*a* in an optically desirable state, in order to maintain the good imaging state (imaging performance) of the position detection system 16. This adjustment (calibration) of the position detection system 16 uses two evaluation indices, that is, a lateral shift amount when the alignment mark 19 formed on the substrate 3 is defocused, and the asymmetry of an image of the alignment mark 19 (the degree of asymmetrical distortion of the image).

Figure 6:
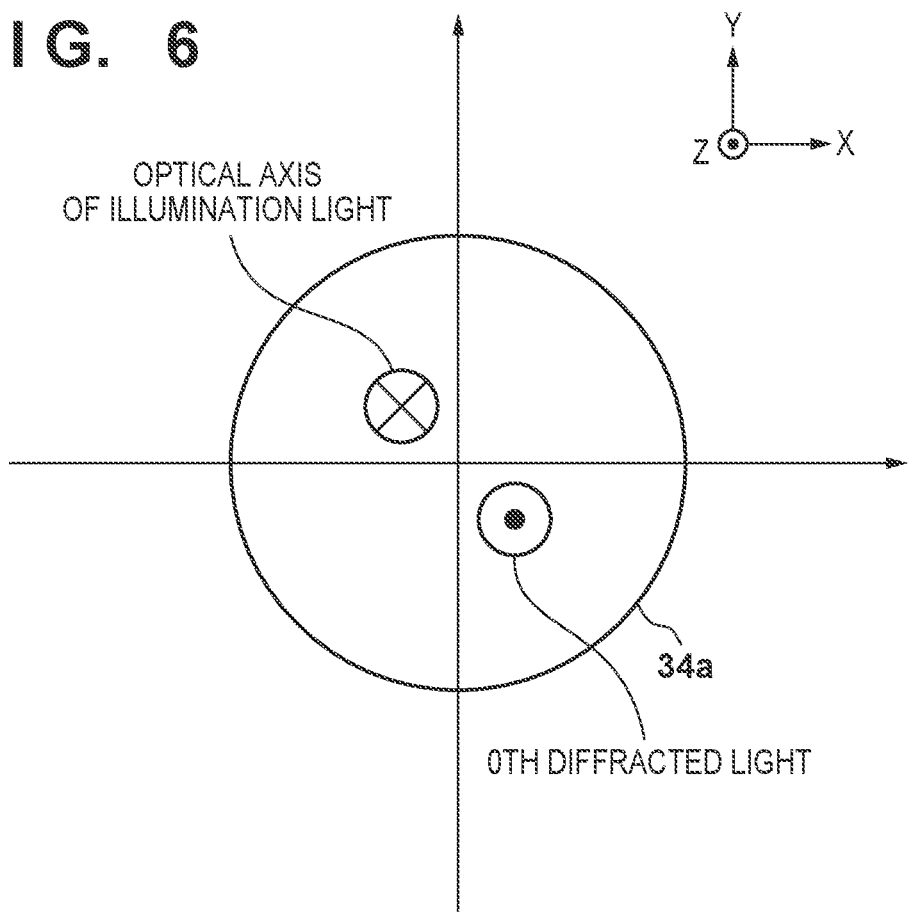
FIG. 6 is a view illustrating an example of the state of the position detection system.

FIG. 6 is a view showing the state of the position detection system 16 before the aperture stop 24*a* to be arranged in the optical path of the illumination system ILS is adjusted. In FIG. 6, a circle indicated by the thick line shows a state before the aperture stop 34*a* to be arranged in the optical path of the imaging system IMS is adjusted. Referring to FIG. 6, before the aperture stop 24*a* is adjusted, the optical axis of light (illumination light) for illuminating the substrate 3 shifts from a direction perpendicular to the substrate 3, so the direction of 0th-order diffracted light reflected by the substrate 3 shifts from the center of the aperture stop 34*a* before adjustment. As described previously, the aperture stop 24*a* is positioned in the optical Fourier transform plane with respect to the plane where the substrate 3 is positioned, so adjusting the aperture stop 24*a* is equivalent to adjusting an effective light source, that is, adjusting the angle of light to be incident on the substrate 3 (the incidence angle of the illumination light). Accordingly, it is possible, by driving (adjusting) the aperture stop 24*a* in the state shown in FIG. 6, to correct (remedy) a component in the driving direction of the optical axis of the inclined illumination light. If this component is left uncorrected, it is obvious that an image of the alignment mark 19 on the substrate laterally shifts when the alignment mark 19 is detected in a different focusing position, resulting in an error in position detection of the alignment mark 19.

In principle, the 0th-order diffracted light reflected by the substrate 3 can be adjusted to the pupil center on the detection side by driving (adjusting) the aperture stop 34*a* indicated by the thick line in FIG. 6. Since the aperture stop 34*a* is positioned in the optical Fourier transform plane with respect to (the photoelectric conversion plane of) the photoelectric conversion element 37, adjusting the aperture stop 34*a* is equivalent to selecting the order of the diffracted light from the substrate 3, which is detected by the photoelectric conversion element 37.

Generally, diffracted light from a symmetrical detection target such as the alignment mark 19 is generated by positive-negative symmetry around the 0th-order diffracted light. As described above, therefore, the position detection system 16 can implement a good imaging state having little distortion by adjusting the 0th-order diffracted light to the pupil center on the detection side. If the illumination light is inclined, however, asymmetrical distortion occurs in an image of the alignment mark 19, and this affects the position detection accuracy of the alignment mark 19. This is mainly caused by two factors: the alignment mark 19 actually has a three-dimensional thickness; and the reflected light from the substrate 3 passes a region which is away from the optical axis of the imaging system IMS and in which the aberration correction state is low.

It is, therefore, basically necessary to match the aperture stops 24*a* and 34*a* while taking the two evaluation indices, that is, the lateral shift amount when the alignment mark 19 formed on the substrate 3 is defocused, and the asymmetry of an image of the alignment mark 19. Basically (that is, in an ideal state in which the position detection system 16 has no aberration), "to match the aperture stops 24*a* and 34*a*" means matching their centers. If, however, the position detection system 16 has a large comatic aberration, the aperture stops 24*a* and 34*a* are sometimes slightly shifted from each other so as to block the diffracted light passing the region on the pupil plane where the aberration correction state is low, even though the symmetry of the diffracted light to be taken into the imaging system IMS is damaged.

When introducing and operating the exposure apparatus 100, a step (adjustment/confirmation step) of adjusting the state of the exposure apparatus 100 and confirming that the state is good is normally provided when the exposure apparatus 100 is shipped and installed. In this adjustment/confirmation step, the initial positions of the aperture stops 24*a* and 34*a* are decided while taking the two evaluation indices, that is, the lateral shift amount when the alignment mark 19 formed on the substrate 3 is defocused, and the asymmetry of an image of the alignment mark 19, as described previously. For example, the initial positions of the aperture stops 24*a* and 34*a* are decided (adjusted) so that the lateral shift amount and asymmetry of an image of the alignment mark 19 formed on a photoelectric conversion element when the alignment mark 19 is defocused fall within allowable ranges. In this embodiment, data (initial data) to be explained below is obtained for each of the aperture stops 24*a* and 34*a*, so that the data can be used when actually introducing and operating the exposure apparatus 100 having the position detection system 16.

If (the center of) each of the aperture stops 24*a* and 34*a* shifts from the initial position decided in the adjustment/confirmation step, there are generally four degrees of freedom about driving (the driving amounts) of the aperture stops 24*a* and 34*a* in order to correct the shifts from the initial positions. More specifically, two linearly independent directions in a plane perpendicular to the optical axis exist for each of the aperture stops 24*a* and 34*a*. Although these two directions need not be perpendicular to each other, they will be represented by using suffixes x and y. Note that when the guide rail system as shown in FIG. 4 is adopted as the switching mechanism for switching aperture stops in one of the illumination system ILS and the imaging system IMS of the position detection system 16, the number of degrees of freedom about driving of the aperture stops 24*a* and 34*a* is less than four.

In a case in which the aperture stops 24*a* and 34*a* shift from the initial positions when calibrating the position detection system 16 while the exposure apparatus 100 is in operation, the driving amounts (correction driving amounts) of the aperture stops 24*a* and 34*a* are unknowns to be obtained to correct the shifts. Equation 1 below shows them as four-vector.

$$\begin{pmatrix} PILx \\ PDTx \\ PILy \\ PDTy \end{pmatrix} \quad (1)$$

In equation 1, PILx is a correction driving amount in the x direction of the aperture stop 24a arranged in the optical path of the illumination system ILS, and PILy is a correction driving amount in the y direction of the aperture stop 24a arranged in the optical path of the illumination system ILS. PDLx is a correction driving amount in the x direction of the aperture stop 34a arranged in the optical path of the imaging system IMS, and PDLy is a correction driving amount in the y direction of the aperture stop 34a arranged in the optical path of the imaging system IMS.

While the driving mechanism 18 is driving the substrate stage 4 in the Z direction, the position detection system 16 detects the alignment mark 19 for adjustment (calibration). The alignment mark 19 for adjustment need not be formed on the substrate 3, and need only be formed on the substrate stage 4 and driven in the Z direction together with the substrate stage 4. For example, the alignment mark 19 for adjustment can also be formed on the stage reference plate 11. When the alignment mark 19 for adjustment is formed on the stage reference plate 11, the calibration method of this embodiment can be performed in a self-contained manner by using only the constituent elements of the exposure apparatus 100.

If the optical axis of the illumination system ILS of the position detection system 16 shifts from a vertical direction with respect to the plane on which the alignment mark 19 exists, an image of the alignment mark 19 to be detected by the photoelectric conversion element 37 shifts in the horizontal direction as the substrate stage 4 is driven in the Z direction. Therefore, from the shift directions (x and y directions) and the shift amount of the image of the alignment mark 19 when the substrate stage 4 is driven in the Z direction by a micro unit amount δZ, the degree of a shift of the optical axis of light (illumination light) for illuminating the substrate 3 from the vertical direction can be evaluated. In the following explanation, the degree of the shift of the illumination light from the vertical direction with respect to the substrate 3 (that is, the shift amount of the image of the alignment mark 19 on the photoelectric conversion element with respect to the defocus amount of the alignment mark 19) will be called the defocus characteristic as an evaluation index.

The amount (shift amount) by which (the center of) each of the aperture stops 24a and 34a shifts from the initial position decided in the adjustment/confirmation step is normally so small that the defocus characteristic appearing as a result can be regarded as proportional to the shift amount. Accordingly, four independent linear relationships need only be used to decide the four correction driving amounts represented by equation 1.

In this embodiment, to obtain the four independent linear relationships (equations) as described above, two different combinations are selected from a plurality of combinations of the aperture stops 24a and 34a. More specifically, two different combinations of the aperture stops 24a and 34a are selected by selecting one aperture stop from each of the plurality of aperture stops 24a shown in FIG. 4 and the plurality of aperture stops 34a shown in FIG. 5. In this embodiment, these two combinations will be referred to as mode 1 (the first combination) and mode 2 (the second combination). As the combination of the aperture stops 24a and 34a to be selected as mode 1 or mode 2 can also be selected from the existing combinations for implementing illumination modes already set in the exposure apparatus 100, in accordance with a purpose to be explained below. Note that as will be described later, it is also possible to exclusively set an aperture stop combination having a structure optimized for the purpose of calibrating the position detection system 16.

When the two combinations for implementing mode 1 and mode 2 are selected as described above, the fluctuation amount of the defocus characteristic can be represented by four-vector as indicated by equation 2 below:

$$\begin{pmatrix} \Delta 1x \\ \Delta 2x \\ \Delta 1y \\ \Delta 2y \end{pmatrix} \quad (2)$$

Figure 7:
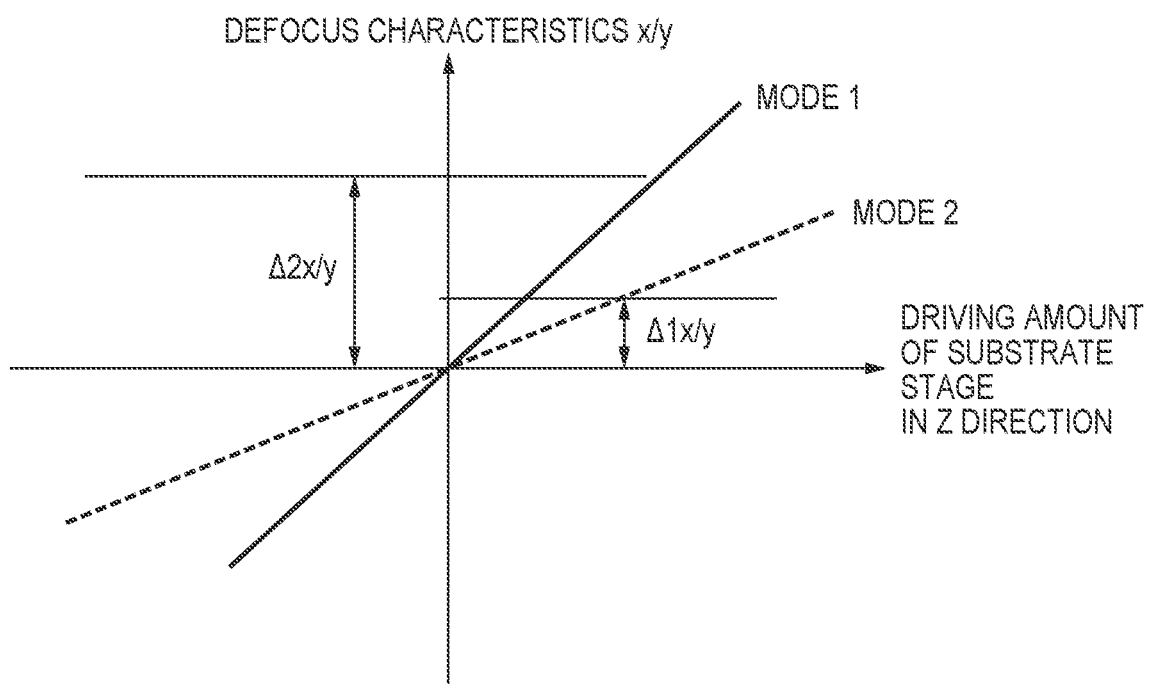
FIG. 7 is a view illustrating an example of the relationship between the driving amount of a substrate stage and the fluctuation amount of a defocus characteristic.

In equation 2, $\Delta 1x$ indicates the fluctuation amount of the defocus characteristic in the x direction in mode 1, and $\Delta 2x$ indicates the fluctuation amount of the defocus characteristic in the x direction in mode 2. Also, $\Delta 1y$ indicates the fluctuation amount of the defocus characteristic in the y direction in mode 1, and $\Delta 2y$ indicates the fluctuation amount of the defocus characteristic in the y direction in mode 2. FIG. 7 shows the concept indicating that these fluctuation amounts of the defocus characteristic are proportional to the driving amount of the substrate stage 4 in the Z direction. FIG. 7 is a view showing the relationship between the driving amount of the substrate stage 4 in the Z direction and the fluctuation amount of the defocus characteristic. In FIG. 7, the abscissa indicates the driving amount of the substrate stage 4 in the Z direction, and the ordinate indicates (the fluctuation amount of) the defocus characteristic.

In the adjustment/confirmation step of this embodiment, the values (D01x, D02x, D01y, and D02y) of the defocus characteristics in the x and y directions in modes 1 and 2 when the initial adjustment is complete are measured and obtained as initial data (reference defocus characteristics). In addition, fluctuation amount vectors of the defocus characteristic when fluctuating the aperture stops 24a and 34a by a unit amount in the pupil planes of the illumination system ILS and the imaging system IMS are obtained as initial data by executing procedures (1), (2), (3), and (4) to be explained below.

Procedure (1): When only the aperture stop 24a arranged in the optical path of the illumination system ILS of the position detection system 16 is fluctuated by a unit amount in the x direction, fluctuation vectors ($\Delta 1x$, $\Delta 2x$, $\Delta 1y$, and $\Delta 2y$) of the defocus characteristic are obtained as (A, B, C, and D).

Procedure (2): When only the aperture stop 34a arranged in the optical path of the imaging system IMS of the position detection system 16 is fluctuated by a unit amount in the x direction, fluctuation vectors ($\Delta 1x$, $\Delta 2x$, $\Delta 1y$, and $\Delta 2y$) of the defocus characteristic are obtained as (E, F, G, and H).

Procedure (3): When only the aperture stop 24a arranged in the optical path of the illumination system ILS of the position detection system 16 is fluctuated by a unit amount in the y direction, fluctuation vectors ($\Delta 1x$, $\Delta 2x$, $\Delta 1y$, and $\Delta 2y$) of the defocus characteristic are obtained as (I, J, K, and L).

Procedure (4): When only the aperture stop 34a arranged in the optical path of the imaging system IMS of the position detection system 16 is fluctuated by a unit amount in the y direction, fluctuation vectors (Δ1x, Δ2x, My, and Δ2y) of the defocus characteristic are obtained as (M, N, O, and P).

When calibrating the position detection system 16 (when adjusting the positions of the aperture stops 24a and 34a) in a case where the operation of the exposure apparatus 100 is started and the aperture stops 24a and 34a shift from the initial positions decided in the adjustment/confirmation step, a procedure to be explained below is executed.

First, in a state in which the aperture stops 24a and 34a exist in positions (first positions) shifted from the initial positions, values (D1x, D2x, D1y, and D2y) of the defocus characteristics in the x and y directions in modes 1 and 2 are measured and obtained. Consequently, the correction driving amounts (PILx, LDTx, PILy, and DTy) of the aperture stops 24a and 34a as the unknowns in equation 1 can be calculated from simultaneous equations with four unknowns indicated by equation 3 below:

$$\begin{pmatrix} D1x - D01x \\ D2x - D02x \\ D1y - D01y \\ D2y - D02y \end{pmatrix} = \begin{pmatrix} A & E & K & M \\ B & F & L & N \\ C & G & K & O \\ D & H & L & P \end{pmatrix} \begin{pmatrix} P_{ILx} \\ P_{DTx} \\ P_{ILy} \\ P_{DTy} \end{pmatrix} \quad (3)$$

The solution of the simultaneous equations with four unknowns indicated by equation 3 is simple. Therefore, the equations can be solved by an arithmetic unit in the exposure apparatus 100, for example, the control unit 17, and can also be solved by an external apparatus (arithmetic device) different from the exposure apparatus 100.

The switching mechanisms 38 and 39 are controlled (driven) based on the correction driving amounts calculated from the simultaneous equations with four unknowns indicated by equation 3, thereby adjusting the positions of the aperture stops 24a and 34a (returning them to the initial positions), and achieving the calibration of the position detection system 16.

In this embodiment, the initial positions decided in the adjustment/confirmation step are set as the reference positions of the aperture stops 24a and 34a, and, if the aperture stops 24a and 34a shift from the initial positions, the aperture stops 24a and 34a are simply returned to the initial positions. However, the reference positions as the positions to which the aperture stops 24a and 34a are returned are not limited to the initial positions, and can be set at arbitrary positions. Also, if there is a purpose of intentionally changing the characteristics of the position detection system 16 in order to cope with the specialty of an individual process substrate, the left side of equation 3 can be set as the value (target value) of the defocus characteristic corresponding to an arbitrary target.

In this embodiment, the number of combinations (modes) of the aperture stops 24a and 34a necessary to calibrate the position detection system 16 is at least two. However, it is also possible to execute the above-described procedures by preparing more than two combinations, and obtain the correction driving amounts of the aperture stops 24a and 34a by comprehensively taking the results into consideration. For example, when N combinations are prepared, N(N−1)/2 correction driving amounts (PILx, LDTx, PILy, and DTy) are obtained, so the weighted average values of these vectors can be adopted.

Also, alignment light (non-exposure light) used in the exposure apparatus 100 generally contains a plurality of wavelength bands, for example, at least two wavelength bands of 450 nm or more, in order to cope with various processes. In a case like this, weighted averaging by the wavelength can be performed.

Next, a selection (combination) of the aperture stops 24a and 34a suitable when actually performing the calibration method of the position detection system 16 according to this embodiment will be explained. As is apparent from equation 3, this embodiment calculates the correction driving amounts of the aperture stops 24a and 34a from the linear equations (the simultaneous equations with four unknowns). Accordingly, if the value of the determinant of a coefficient matrix indicated by equation 4 below is close to zero, the accuracy of the correction driving amounts (PILx, LDTx, PILy, and DTy) of the aperture stops 24a and 34a calculated from equation 3 decreases. Therefore, the value of the determinant of the coefficient matrix indicated by equation 4 must be set at a value away from zero.

$$\begin{vmatrix} A & E & K & M \\ B & F & L & N \\ C & G & K & O \\ D & H & L & P \end{vmatrix} \quad (4)$$

Figure 8:
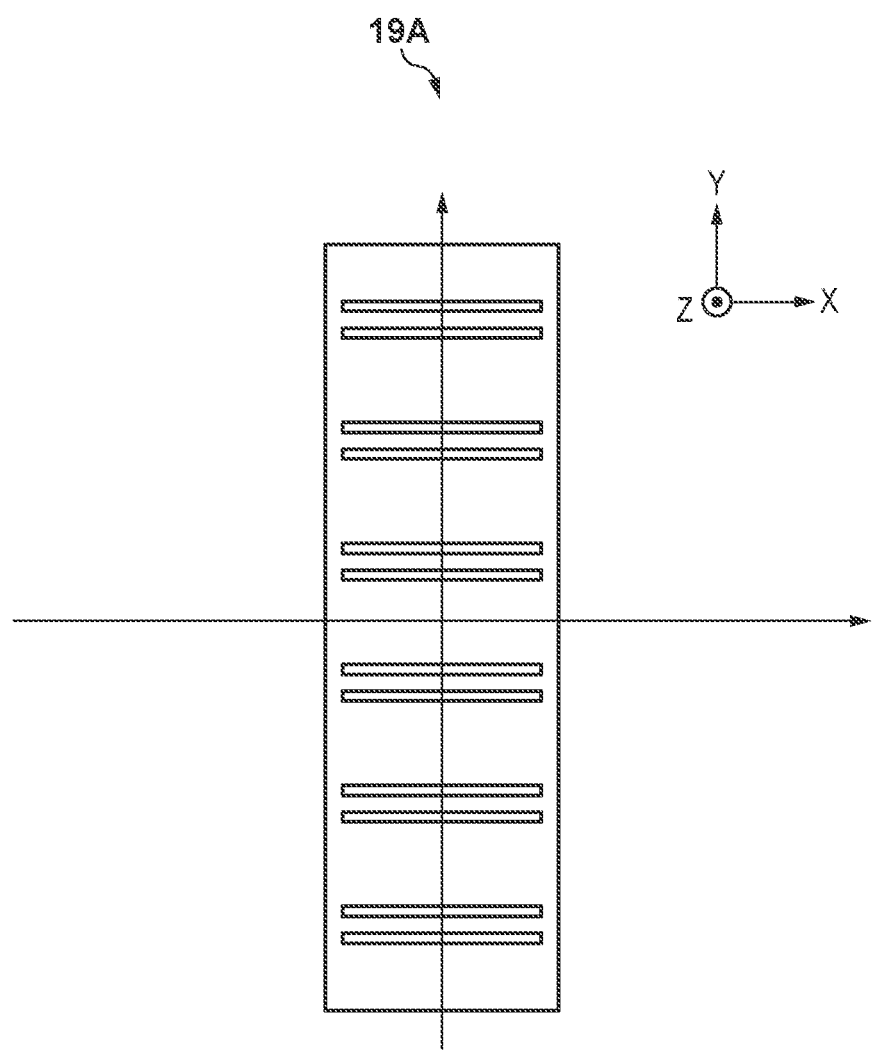
FIG. 8 is a view illustrating an example of an alignment mark.

An alignment mark 19A as shown in FIG. 8 can be used as the alignment mark 19 that can be used in the exposure apparatus 100 (the position detection system 16) and can also be simplified. FIG. 8 is a view showing the alignment mark 19A including a structure that generates diffracted light in only one of two directions perpendicular to each other in a plane (X-Y plane) perpendicular to the optical axis of the position detection system 16. The alignment mark 19A generates diffracted light in only the Y direction of the coordinate axes shown in FIG. 8, due to the symmetry of the mark. Accordingly, even when the aperture stops 24a and 34a are driven in the X direction in the coordinate axes shown in FIG. 8, the defocus characteristic in the X direction probably hardly fluctuates. By using the alignment mark 19A with which the direction in which no diffracted light is generated and the direction in which diffracted light is generated respectively match the X and Y directions in the position detection system 16 as described above, equation 4 is accurately approximated to a block diagonalization matrix as indicated by equation 5 below:

$$\begin{pmatrix} A & E & 0 & 0 \\ B & F & 0 & 0 \\ 0 & 0 & K & O \\ 0 & 0 & L & P \end{pmatrix} \quad (5)$$

When the X and Y directions are separated, the determinant indicated by equation 5 is (AF−BE)·(KP−LO), that is, the product of the determinants of submatrices existing in the diagonal positions. Therefore, modes 1 and 2 (the combination of the aperture stops 24a and 34a) need only be so selected as to set the values of AF−BE and KP−LO apart from zero at the same time.

It is possible to prepare two combinations of the aperture stops 24a and 34a as described above. Assume, for example, that the aperture stops 24a and 34a have apertures (openings) that are perfect circles (almost perfect circles) having a common center (that is, the positions of the centers overlap each other), and having different radii. In this case, it is only necessary to combine (select) the aperture stops 24a and 34a so that the aperture stops 24a are largely different in only the radius of the aperture (aperture (opening) radius) in modes 1 and 2, and the aperture stops 34a have a common (the same) aperture radius in modes 1 and 2. More specifically, the aperture (opening) ratio of the aperture stop 24a included in mode 1 to the aperture stop 24a included in mode 2 is set to be twice or more. In addition, the aperture stops 34a included in modes 1 and 2 have an aperture radius larger than those of the aperture stops 24a included in modes 1 and 2. A combination like this is optically already known. For example, the mode including the aperture stop 24a having a large aperture radius is a mode giving importance to the resolving power, and the mode including the aperture stop 34a having a small aperture radius is a mode giving importance to the contrast.

"The aperture radius of the aperture stop 24a is small" means that the radius of light passing through the aperture stop 34a is small, so the light passes inside the aperture stop 34a. In the mode giving importance to the contrast, therefore, the influence of the shift of the aperture stop 34a on the defocus characteristic is extremely small, compared to the mode giving importance to the resolving power. Since this means that the values of F and P are close to zero in equation 5, $(AF-BE) \cdot (KP-LO) \neq BE \cdot LO$ holds, so it is possible to avoid the value of the whole determinant from becoming close to zero.

Table 1 below shows practical numerical value examples of the aperture stops 24a and 34a in modes 1 and 2 when the aperture stops 24a and 34a have perfectly circular apertures having a common center and different radii as described above.

TABLE 1

|        | Aperture Stop 24a (NA) | Aperture Stop 34a (NA) |
|--------|------------------------|------------------------|
| Mode 1 | 0.35                   | 0.4                    |
| Mode 2 | 0.15                   | 0.4                    |

The process (calibration method) of calibrating the position detection system 16 will be explained below with reference to FIG. 9. The control unit 17 performs this process by comprehensively controlling the units of the exposure apparatus 100 including the position detection system 16. In other words, the control unit 17 also functions as a processing unit for performing the process of calibrating the position detection system 16. Instead of the control unit 17, however, an external apparatus (information processing apparatus) can also perform the process of calibrating the position detection system 16 by comprehensively controlling the units of the exposure apparatus 100 including the position detection system 16.

In this embodiment, the exposure apparatus 100 is so configured as to be able to calibrate the position detection system 16 at any arbitrary timing while the exposure apparatus 100 is in operation. However, the aperture stops 24a and 34a actually shift from the initial positions decided in the adjustment/confirmation step in a case where the supply of power to the exposure apparatus 100 is shut down and resumed after that (at the time of power refeeding). Also, the aperture stops 24a and 34a may shift from the initial positions decided in the adjustment/confirmation step when the exposure apparatus 100 is reset (at the time of resetting) for an operation of returning from some sort of trouble. Accordingly, the effectiveness of the operation of the exposure apparatus 100 can be increased by calibrating the position detection system 16 at the time of refeeding of power or resetting as described above. Note that even at the time of refeeding of power or resetting, the user can determine not to calibrate the position detection system 16.

Referring to FIG. 9, in S101, the current defocus characteristics (D1x and D1y) (after the aperture stops 24a and 34a have shifted from the initial positions) are obtained (measured) in preselected mode 1. More specifically, the switching mechanisms 38 and 39 are driven to arrange the aperture stop 24a selected in mode 1 in the pupil plane of the illumination system ILS, and arrange the aperture stop 34a selected in mode 1 in the pupil plane of the imaging system IMS. In addition, the substrate stage 4 is driven such that the alignment mark 19 is positioned within the visual field of the position detection system 16. Then, while the substrate stage 4 is driven in the Z direction, the current defocus characteristics in mode 1 are obtained by detecting the alignment mark 19 by the position detection system 16.

In S102, the current defocus characteristics (D2x and D2y) (after the aperture stops 24a and 34a have shifted from the initial positions) are obtained (measured) in preselected mode 2. More specifically, the switching mechanisms 38 and 39 are driven to arrange the aperture stop 24a selected in mode 2 in the pupil plane of the illumination system ILS, and arrange the aperture stop 34a selected in mode 2 in the pupil plane of the imaging system IMS. In addition, the substrate stage 4 is driven such that the alignment mark 19 is positioned within the visual field of the position detection system 16. Then, while the substrate stage 4 is driven in the Z direction, the current defocus characteristics in mode 2 are obtained by detecting the alignment mark 19 by the position detection system 16.

In this embodiment, in S101 and S102 (in the first step), the current defocus characteristics (first defocus characteristics) are obtained in each of modes 1 and 2.

In S103, differences between the defocus characteristics (D01x, D02x, D01y, and D02y) in modes 1 and 2 obtained in advance in the adjustment/confirmation step, and the current defocus characteristics (D1x, D2x, D1y, and D2y) in modes 1 and 2 obtained in S101 and S102, are obtained.

In S104, the driving amounts of the aperture stops 24a and 34a necessary to correct the shifts from the initial positions of the aperture stops 24a and 34a, that is, the correction driving amounts (PILx, PILy, PDLx, and PDLy) are decided. As described previously, the correction driving amounts of the aperture stops 24a and 34a can be calculated from the simultaneous equations with four unknowns indicated by equation 3 based on the differences obtained in S103. Note that various kinds of data including initial data required to calculate the correction driving amounts of the aperture stops 24a and 34a, that is, required to solve the simultaneous equations with four unknowns indicated by equation 3 can be read out from a storage area formed in the exposure apparatus 100, and can also be read out from an external storage area.

In S105, the aperture stop 24a (the switching mechanism 38) and the aperture stop 34a (the switching mechanism 39) are driven in accordance with the correction driving amounts (PILx, PILy, PDLx, and PDLy) decided in S104, thereby adjusting the positions of the aperture stops 24a and 34a.

In this embodiment, in S103, S104, and S105 (in the second step), position adjustment (pupil adjustment) of each of the aperture stops 24a and 34a is performed based on the reference defocus characteristics and the current defocus characteristics in modes 1 and 2.

As described above, according to the calibration method of the position detection system 16 in this embodiment, the position detection system 16 can be calculated on the user site at an arbitrary timing in a self-contained manner without requiring any special tool in addition to the exposure apparatus 100. Also, since an encoder for detecting shifts (pupil position shifts) of the aperture stops 24a and 34a is unnecessary, it is possible to decrease the cost and remove a heat source at the same time, and improve the position detection accuracy. According to this embodiment, therefore, the exposure apparatus 100 superior in cost and overlay accuracy can be provided.

A method of manufacturing an article according to the embodiment of the present invention is suitable for manufacturing an article such as a flat panel display, a liquid crystal display element, a semiconductor device, a MEMS or the like. This method of manufacturing includes a step of exposing a substrate coated with a photosensitive agent by using the above-described exposure apparatus 100 and a step of developing the exposed photosensitive agent. An etching step and an ion implantation step are performed on the substrate by using the pattern of the developed photosensitive agent as a mask, thereby forming a circuit pattern on the substrate. By repeating the steps such as these exposure, development, and etching steps, a circuit pattern formed from a plurality of layers is formed on the substrate. In a subsequent step, dicing (processing) is performed on the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

The present invention can also be implemented by a process of supplying a program that implements one or more functions of the above-described embodiment to a system or an apparatus via a network or a storage medium, and causing one or more processor in a computer of the system or apparatus to read out and execute the program. Furthermore, the present invention can also be implemented by a circuit (for example, an ASIC) that implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-070268 filed on Apr. 21, 2022, which is hereby incorporated by reference herein in its entirety.

What is claimed is:

1. A calibration method of a detection system including an illumination system configured to illuminate a detection target, and an imaging system configured to form an image of light from the detection target on a photoelectric conversion element, wherein
the illumination system includes a plurality of first apertures selectively arranged in a pupil plane of the illumination system and having different openings,
the imaging system includes a plurality of second apertures selectively arranged in a pupil plane of the imaging system and having different openings, and
the calibration method comprises:
obtaining, for each of at least two combinations of first apertures and second apertures, each of which is formed by selecting one first aperture and one second aperture from the plurality of first apertures and the plurality of second apertures a first defocus characteristic indicating a shift amount of the image on the photoelectric conversion element with respect to a defocus amount of the detection target in a state in which each of the first aperture and the second aperture is positioned in a first position shifted from a reference position, and
performing position adjustment on each of the first aperture and the second aperture such that each of the first aperture and the second aperture is positioned in the reference position, based on a reference defocus characteristic indicating a shift amount of the image on the photoelectric conversion element with respect to a defocus amount of the detection target in a state in which each of the first aperture and the second aperture is positioned in the reference position, and on the first defocus characteristic obtained in the obtaining,
wherein in the performing the position adjustment, a driving amount of each of the first aperture and the second aperture required for the position adjustment is obtained from a difference between the first defocus characteristic and the reference defocus characteristic, and from a fluctuation amount of the reference defocus characteristic when the first aperture and the second aperture are fluctuated by a unit amount in the pupil plane of the illumination system and the pupil plane of the imaging system.

2. The method according to claim 1, wherein the reference defocus characteristic and the fluctuation amount of the reference defocus characteristic are obtained in advance before the obtaining is performed.

3. The method according to claim 1, wherein the first aperture arranged in the pupil plane of the illumination system and the second aperture arranged in the pupil plane of the imaging system have perfectly circular openings having central positions overlapping each other and different radii.

4. The method according to claim 1, wherein
the at least two combinations include a first combination and a second combination, and
an opening ratio of a first aperture, of the plurality of first apertures, included in the first combination to a first aperture, of the plurality of first apertures, included in the second combination is not less than twice.

5. The method according to claim 1, wherein
the at least two combinations include a first combination and a second combination,
a second aperture, of the plurality of second apertures, included in the first combination is also included as the second aperture, of the plurality of second apertures, included in the second combination, and
the second aperture included in the first combination and in the second combination has an opening radius larger than an opening radius of a first aperture, of the plurality of first apertures, included in the first combination and a first aperture, of the plurality of first apertures, included in the second combination.

6. The method according to claim 1, wherein the light is light including at least two types of wavelength bands of not less than 450 nm.

7. The method according to claim 1, wherein the detection target includes a structure configured to generate diffracted light in only one of two directions perpendicular to each other in a plane perpendicular to an optical axis of the detection system.

8. The method according to claim 1, wherein the reference position includes an initial position in which a position of each of the first aperture and the second aperture is adjusted such that a lateral shift amount and asymmetry of the image formed on the photoelectric conversion element when the detection target is defocused fall within allowable ranges.

9. A non-transitory computer-readable storage medium storing a program for causing a computer to execute the calibration method defined in claim 1.

10. A detection system for detecting a position of a detection target, comprising:
    an illumination system configured to illuminate the detection target;
    an imaging system configured to form an image of light from the detection target on a photoelectric conversion element; and
    a processing unit configured to perform a process of calibrating the detection system, wherein
    the illumination system includes a plurality of first apertures selectively arranged in a pupil plane of the illumination system and having different openings,
    the imaging system includes a plurality of second apertures selectively arranged in a pupil plane of the imaging system and having different openings, and
    the processing unit obtains, for each of at least two combinations of first apertures and second apertures, each of which is formed by selecting one first aperture and one second aperture from the plurality of first apertures and the plurality of second apertures, a first defocus characteristic indicating a shift amount of the image on the photoelectric conversion element with respect to a defocus amount of the detection target in a state in which each of the first aperture and the second aperture is positioned in a first position shifted from a reference position, and
    performs position adjustment on each of the first aperture and the second aperture such that each of the first aperture and the second aperture is positioned in the reference position, based on a reference defocus characteristic indicating a shift amount of the image on the photoelectric conversion element with respect to a defocus amount of the detection target in a state in which each of the first aperture and the second aperture is positioned in the reference position, and on the first defocus characteristic,
    wherein in the position adjustment performed by the processing unit, a driving amount of each of the first aperture and the second aperture required for the position adjustment is obtained from a difference between the first defocus characteristic and the reference defocus characteristic, and from a fluctuation amount of the reference defocus characteristic when the first aperture and the second aperture are fluctuated by a unit amount in the pupil plane of the illumination system and the pupil plane of the imaging system.

11. An exposure apparatus for exposing a substrate, comprising:
    a detection system defined in claim 10 and configured to detect a mark formed on the substrate as a detection target; and
    a control unit configured to adjust a position of the substrate based on a position of the mark detected by the detection system.

12. An article manufacturing method comprising:
    exposing a substrate using an exposure apparatus defined in claim 11;
    developing the exposed substrate; and
    manufacturing an article from the developed substrate.

* * * * *